(12) United States Patent
Wong et al.

(10) Patent No.: US 8,088,676 B2
(45) Date of Patent: Jan. 3, 2012

(54) METAL-INDUCED CRYSTALLIZATION OF AMORPHOUS SILICON, POLYCRYSTALLINE SILICON THIN FILMS PRODUCED THEREBY AND THIN FILM TRANSISTORS PRODUCED THEREFROM

(75) Inventors: Man Wong, Sai Kung (HK); Hoi-Sing Kwok, Kowloon (HK); Zhiguo Meng, Sai Kung (HK); Dongli Zhang, Kowloon (HK); Xuejie Shi, Kowloon (HK)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 11/413,073

(22) Filed: Apr. 27, 2006

(65) Prior Publication Data
US 2006/0263957 A1 Nov. 23, 2006

Related U.S. Application Data

(60) Provisional application No. 60/675,300, filed on Apr. 28, 2005.

(51) Int. Cl.
*H01L 21/20* (2006.01)
*H01L 21/36* (2006.01)
(52) U.S. Cl. . 438/486; 438/386; 438/766; 257/E21.297; 257/E21.316
(58) Field of Classification Search .......... 438/486, 438/368, 766, FOR. 478, 767, 166, 471, 473, 438/FOR. 144, 386, 482, 487; 257/E21.297, 257/E21.316, E21.36, E21.09
See application file for complete search history.

(56) References Cited

U.S. PATENT DOCUMENTS

| | | | |
|---|---|---|---|
| 5,275,851 A | 1/1994 | Fonash et al. | |
| 5,700,333 A | 12/1997 | Yamazaki et al. | |
| 5,879,977 A | 3/1999 | Zhang et al. | |
| 6,100,562 A | 8/2000 | Yamazaki et al. | |
| 6,337,259 B1* | 1/2002 | Ueda et al. | 438/471 |
| 6,420,246 B1 | 7/2002 | Yamazaki et al. | |
| 6,461,943 B1 | 10/2002 | Yamazaki et al. | |
| 6,465,287 B1 | 10/2002 | Yamazaki et al. | 438/162 |
| 6,551,907 B2 | 4/2003 | Ohtani | 438/476 |
| 6,559,036 B1* | 5/2003 | Ohtani et al. | 438/486 |
| 6,664,144 B2 | 12/2003 | Nakajima et al. | 438/143 |
| 6,743,700 B2 | 6/2004 | Asami et al. | |
| 6,821,828 B2 | 11/2004 | Ichijo et al. | 438/166 |
| 6,825,072 B2 | 11/2004 | Yamazaki et al. | |
| 6,927,107 B1* | 8/2005 | Makita et al. | 438/162 |
| 7,115,453 B2* | 10/2006 | Nakamura et al. | 438/166 |
| 2002/0106841 A1* | 8/2002 | Yamazaki et al. | 438/149 |

(Continued)

FOREIGN PATENT DOCUMENTS

JP 2003-100633 * 4/2003
(Continued)

*Primary Examiner* — Matthew Smith
*Assistant Examiner* — Quovaunda Jefferson
(74) *Attorney, Agent, or Firm* — Leydig, Voit & Mayer, Ltd.

(57) ABSTRACT

Crystallization-inducing metal elements are introduced onto an amorphous silicon thin film. A first, low-temperature, heat-treatment induces nucleation of metal-induced crystallization (MIC), resulting in the formation of small polycrystalline silicon "islands". A metal-gettering layer is formed on the resulting partially crystallized thin film. A second, low-temperature, heat-treatment completes the MIC process, whilst gettering metal elements from the partially crystallized thin film. The process results in the desired polycrystalline silicon thin film.

20 Claims, 6 Drawing Sheets

U.S. PATENT DOCUMENTS

| | | |
|---|---|---|
| 2002/0134981 A1 | 9/2002 | Nakamura et al. |
| 2002/0164843 A1 | 11/2002 | Yamazaki et al. |
| 2002/0177283 A1* | 11/2002 | Hwang et al. ............... 438/300 |
| 2002/0192884 A1 | 12/2002 | Chang et al. ............... 438/164 |
| 2003/0134459 A1 | 7/2003 | Tanaka et al. |
| 2004/0058486 A1 | 3/2004 | Ohtani et al. |
| 2004/0115906 A1* | 6/2004 | Makita et al. ............... 438/486 |
| 2004/0121530 A1 | 6/2004 | Yamazaki et al. |
| 2005/0227442 A1 | 10/2005 | Ahn et al. |
| 2007/0284581 A1* | 12/2007 | Yang et al. ............... 257/66 |

FOREIGN PATENT DOCUMENTS

JP    2003 100633 A    4/2003

* cited by examiner

METAL-INDUCED CRYSTALLIZATION OF AMORPHOUS SILICON, POLYCRYSTALLINE SILICON THIN FILMS PRODUCED THEREBY AND THIN FILM TRANSISTORS PRODUCED THEREFROM

CROSS-REFERENCE TO RELATED APPLICATIONS

This application claims priority under 35 U.S.C. §119 to U.S. Provisional Application No. 60/675,300, filed Apr. 28, 2005, which is herein incorporated by reference in its entirety.

FIELD OF THE INVENTION

The present invention relates to the crystallization of amorphous silicon, in particular by way of metal-induced crystallization, polycrystalline silicon thin films produced thereby and thin film transistors produced therefrom.

BACKGROUND OF THE INVENTION

Thin film transistors (TFTs) are used in the construction of active-matrix liquid-crystal displays, active-matrix organic light emitting diode displays, active-matrix e-ink electronic books and active-matrix image sensors. TFTs based on amorphous silicon suffer from low operating speed and lack of a p-type device, making it difficult to realize peripheral circuits. There is a drive to switch to polycrystalline silicon devices obtained from amorphous silicon.

Further, whilst large-area flat-panel liquid-crystal displays can use amorphous-silicon-based TFTs, for smaller area, higher information-content displays, it is recognized that polycrystalline-silicon-based, rather than amorphous-silicon-based, TFTs must be used. Polycrystalline-silicon-based devices can also be used in the fabrication of 3-dimensional integrated circuits. The traditional approach of increasing device density is to improve micro-lithography resolution, the cost of doing which is becoming increasingly prohibitive. An alternative to achieving higher device density is to stack polycrystalline-silicon-based devices of more relaxed lateral dimensions on top of single-crystal devices, potentially at a much reduced micro-lithography cost.

Polycrystalline silicon obtained by conventional low-pressure chemical vapor deposition suffers from relatively high process temperatures (620-650° C.) and poor material quality. Quality can be improved using high temperature annealing (above 1000° C.). However, this is only possible for much more expensive quartz substrates but not for inexpensive glass substrates.

One popular method currently used to form polycrystalline silicon from amorphous silicon is metal-induced crystallization (MIC). Conventional MIC calls for the introduction of a minimum amount of metal elements, necessary for the nucleation and growth of polycrystalline silicon from amorphous silicon, at a temperature between 400° C. to 600° C. Led by nodules of metal silicide at the crystallization front, elongated grains of polycrystalline silicon grow from each crystal nucleus. When the crystallization fronts from neighboring nuclei collide, a well defined collision interface, containing a relatively large amount of metal residual, is formed. Such metal residual is considered a contaminant and degrades the performance of the devices on the resulting polycrystalline silicon thin film.

Two of the more popular approaches to MIC are (1) blanket metal coverage leading to the crystallization of a large area within a short process time and (2) localized metal coverage leading to metal-induced lateral crystallization (MILC), requiring a long process time. For lower residual metal contamination and better device performance, MILC is presently preferred, though at the expense of a significantly longer process time.

Attempts have been made to reduce the amount of residual metal in polycrystalline silicon after it has been produced.

U.S. Pat. No. 6,821,828, issued on 23 Nov. 2004, to Mitsuhiro Ichijo, Taketomi Asami and Noriyoshi Suzuki, and entitled "Method of manufacturing a semiconductor device", proposes performing metal-gettering after an MILC process, using a further amorphous silicon layer containing a noble gas.

U.S. Pat. No. 6,664,144, issued on 16 Dec. 2003, to Setsuo Nakajima and Hisashi Ohtani, and entitled "Method of forming a semiconductor device using a group XV element for gettering by means of infrared light", proposes performing metal-gettering after an MILC process, using a further amorphous silicon layer doped with phosphorus.

U.S. Pat. No. 6,551,907, issued on 22 Apr. 2003, to Hisashi Ohtani, and entitled "Metal-gettering method used in the manufacture of crystalline-Si TFT", proposes using a nickel-containing phosphosilicate glass layer, from which nickel is introduced to enhance crystallization at a low temperature. After crystallization, at a higher temperature, phosphorus is diffused out and getters the nickel.

U.S. Pat. No. 6,465,287, issued on 15 Oct. 2002, to Shunpei Yamazaki, Satoshi Teramoto, Jun Koyama, Yasushi Ogata, Masahiko Hayakawa and Mitsuaki Osame, and entitled "Method for fabricating a semiconductor device using a metal catalyst and high temperature crystallization", proposes performing a metal-gettering process, in an oxidation atmosphere containing halogen element, to MILC produced polycrystalline silicon, which consumes part of the polycrystalline silicon. This is undesirable for very thin films of polycrystalline silicon.

These four patents propose performing MILC and a gettering process one after the other, which will obviously lengthen the total process time.

US patent application publication 2002/0,192,884, published on 19 Dec. 2002, in the names of Chang, Ting-Chang and Chen, Ching-Wei, and entitled "Method for forming thin film transistor with reduced metal impurities", proposes transforming amorphous silicon into polycrystalline silicon after it has already been patterned into source, drain and channel regions, with a gate insulating layer and a gate electrode atop the channel region and the source and drain regions heavily doped. The amorphous silicon film is deposited on a gettering layer. A nickel layer is deposited on top of the source and drain regions, the gate insulating layer and the gate electrode. The amorphous silicon is then crystallized, the source and drain regions by MIC and the channel region by MILC. During the crystallization process, nickel is gettered into the underneath gettering layer.

The presence of the bottom gettering layer and nickel gettered into it may affect the material quality and the characteristics of the devices built on the resulting polycrystalline silicon. Additionally, the gettering layer necessarily becomes part of the device.

SUMMARY OF THE INVENTION

The present invention allows the introduction of a sufficient amount of metal elements to nucleate MIC, while providing a technique for removing some of the metal elements during the subsequent crystallization heat treatment. Consequently, the quality of the resulting polycrystalline silicon is improved and the amount of residual metal elements is reduced.

Removal of metal elements during the crystallization heat treatment is made possible by the introduction of a metal-gettering thin film, in situ, prior to completion of the crystallization heat treatment during MIC. This removes a controlled amount of metal elements in-situ, during the growth of the polycrystalline silicon grains.

Thus the present invention provides a technique of large-area crystallization, but with reduced metal contamination and improved device performance while retaining the advantage of a reduced process time.

The present invention provides, in a first aspect, a method of crystallizing a silicon thin film. The method comprises providing, on a substrate, an amorphous silicon thin film having metal elements therein for Metal Induced Crystallization (MIC) of the amorphous silicon thin film. The method further comprises depositing metal-gettering material on the other side of the amorphous silicon thin film from the substrate, and metal-induced crystallizing the amorphous silicon thin film whilst simultaneously removing the metal elements therefrom by the gettering metal.

The present invention provides, in a second aspect, a method of forming a thin film transistor. The method comprises forming a polycrystalline silicon thin film, and forming a reduced area of the polycrystalline silicon thin film, forming a gate electrode. The method further comprises forming source and drain electrodes from the reduced area polycrystalline silicon thin film, the polycrystalline silicon thin film being formed by crystallizing an amorphous silicon thin film according to the first aspect.

The invention also covers polycrystalline silicon thin films produced by such methods and devices, such as TFTs using such polycrystalline silicon thin films.

BRIEF DESCRIPTION OF THE DRAWINGS

The fabrication of high quality polycrystalline silicon material, polycrystalline silicon films and semiconductor device formed using such polycrystalline silicon material is further described by way of non-limitative example, with reference to the accompanying drawings, in which.

DETAILED DESCRIPTION OF THE INVENTION

Figure 1:
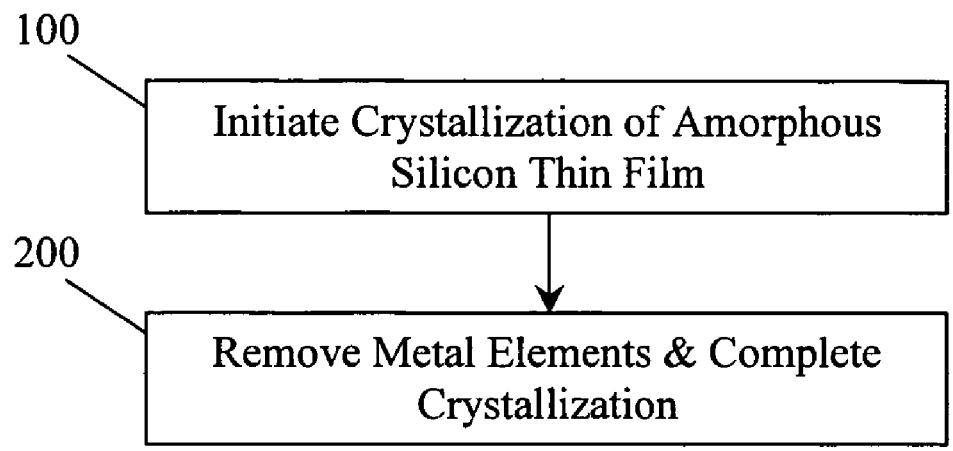
FIG. 1 is a flowchart indicating the basic steps of a process which embodies a first exemplary embodiment of the invention.

FIG. 1 is a flowchart indicating the basic steps of a process which embodies a first exemplary embodiment of the invention. In step 100, crystallization of an amorphous silicon thin film is initiated to provide a partially crystallized amorphous silicon thin film. In step 200, metal elements in the partially crystallized amorphous silicon thin film are removed and the crystallization of the amorphous silicon thin film is completed (to the extent required).

Figure 2:
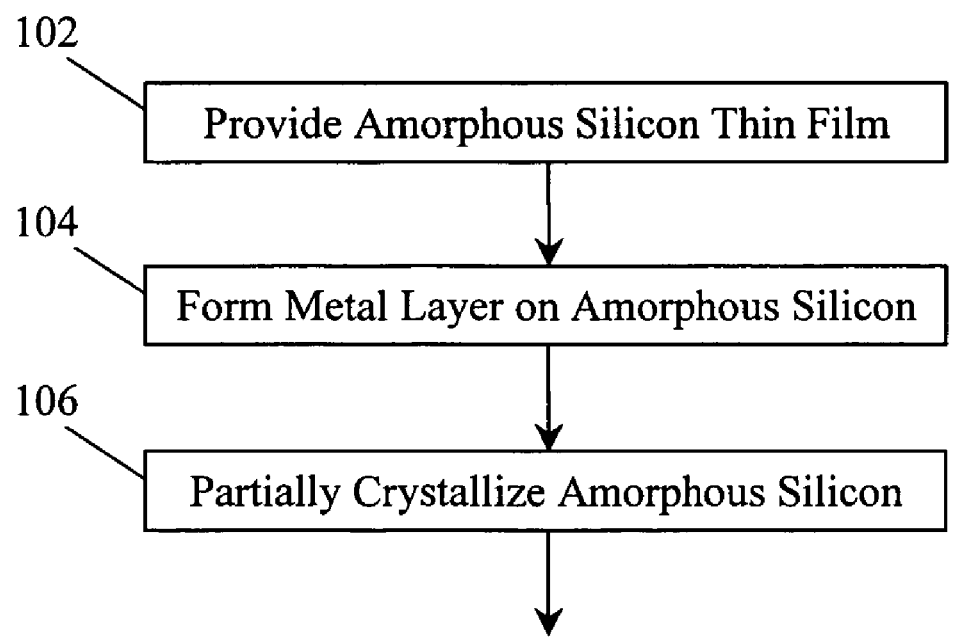
FIG. 2 is a flowchart indicating an exemplary set of component steps in the initiating step 100 of FIG. 1.

FIG. 2 is a flowchart indicating an exemplary set of component steps in the initiating step 100 of FIG. 1. The amorphous silicon thin film is first provided, in step 102. It may be pre-formed prior to the present process or formed as an initial part of the present process in any known way. For example it may be formed at a low temperature, between about 150° C. to about 600° C., using any of a variety of techniques including but not limited to sputtering, evaporation, low-pressure thermal or plasma-enhanced chemical vapor deposition, etc.

Figure 3:
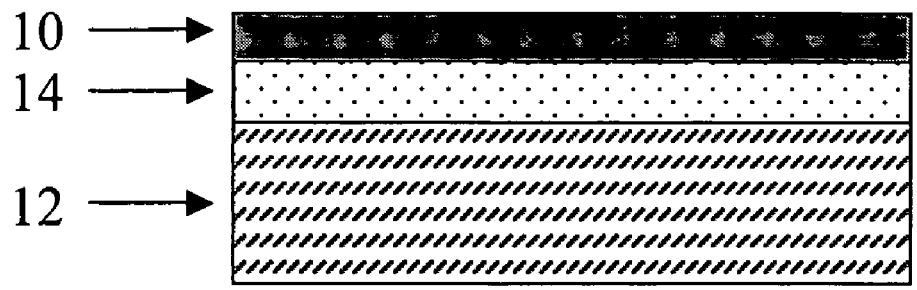
FIG. 3 is a schematic, known cross-section of an amorphous silicon thin film deposited on a substrate covered with an insulator.

FIG. 3 is a schematic, known cross-section of an amorphous silicon thin film 10 deposited on a substrate 12 covered with an insulator 14. The amorphous silicon thin film 10 is typically about 10 nm to about 3000 nm thick, preferably about 10 nm to about 1000 nm thick. The substrate 12 is typically one of high temperature polymer, glass, stainless steel, polycrystalline silicon or single-crystal silicon optionally containing pre-fabricated conventional integrated circuits. The insulator 14 is a buffer layer capable of withstanding process temperatures above about 450° C., preferably up to at least about 650° C., for an extended period of time. This is typically silicon oxide, silicon oxynitride or silicon nitride.

In step 104 of FIG. 2, a crystallization-inducing metal or metal-containing compound layer is formed on one or more exposed regions of the amorphous silicon thin film 10. The thin film of metal or metal-containing compound is typically about 0.1 nm to about 10 nm thick. Suitable materials include nickel or mixtures of nickel, or any of Cr, Pd, Ti, Mo, Al and Au or mixtures of these. The purpose of this metal or metal-containing compound layer is to introduce metal elements into the amorphous silicon thin film to initiate crystallization. Suitable methods for forming the metal or metal-containing compound layer include electron-beam evaporation, sputtering, chemical vapor deposition, ion implantation and immersing the substrate in a solution containing metal elements.

Figure 4:
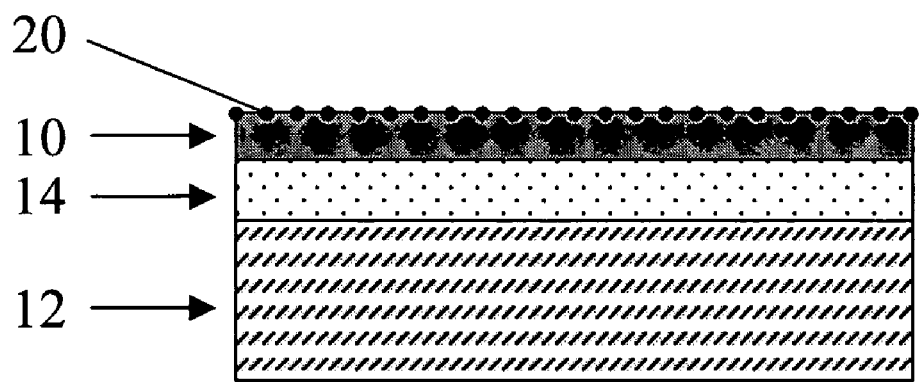
FIG. 4 is a schematic cross-section of the structure of FIG. 3, on which a crystallization-inducing metal layer has been formed.

FIG. 4 is a schematic cross-section of the structure of FIG. 3, on which a crystallization-inducing metal element or metal element containing compound layer 20 has been formed.

In step 106 of FIG. 2, crystallization is initiated and the amorphous silicon thin film 10 is partially crystallized. In this preferred embodiment, it is by way of a first heat-treatment process, using metal-induced crystallization, for example at a temperature between about 400° C. and about 650° C. in a conventional furnace with an inert atmosphere. The length of this step depends on the process temperature. For example, at about 550-590° C., it might last for about 1 to 3 hours. The crystallization is initiated by the crystallization-inducing metal or metal-containing compound layer 20. No more than 80% of the initial amorphous silicon area is generally crystallized in this step.

Figure 5:
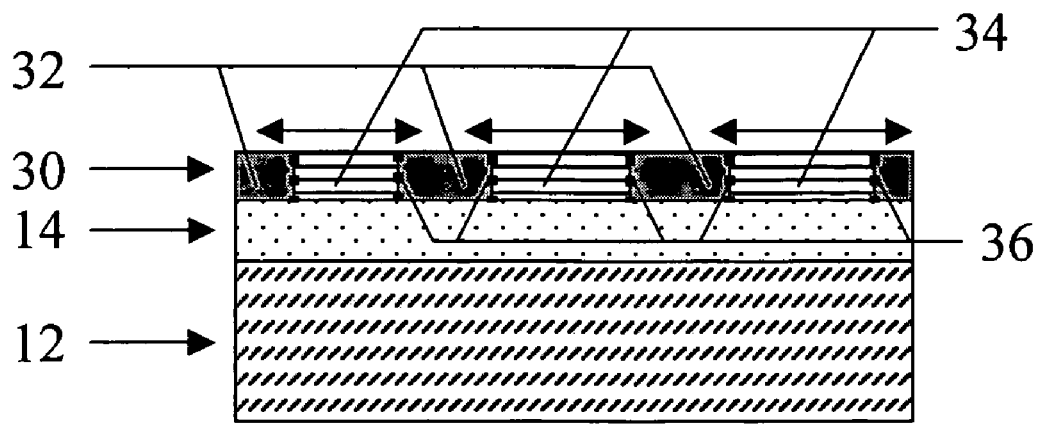
FIG. 5 is a schematic cross-section of the structure of FIG. 4 after partial crystallization.

FIG. 5 is a schematic cross-section of the structure of FIG. 4 after the partial crystallization process, step 106 of FIG. 2. Metal from the metal element or metal element-containing layer 20 diffuses into the amorphous silicon thin film during the partial crystallization step. The amorphous silicon thin film is now a partially crystallized layer 30 of amorphous silicon 32, interspersed with discontinuous polycrystalline silicon "islands" 34, with metal elements 36 diffused or dispersed in both the amorphous silicon 32 and polycrystalline silicon "islands" 34, although especially at the fronts of the polycrystalline silicon "islands" 34.

Figure 6:
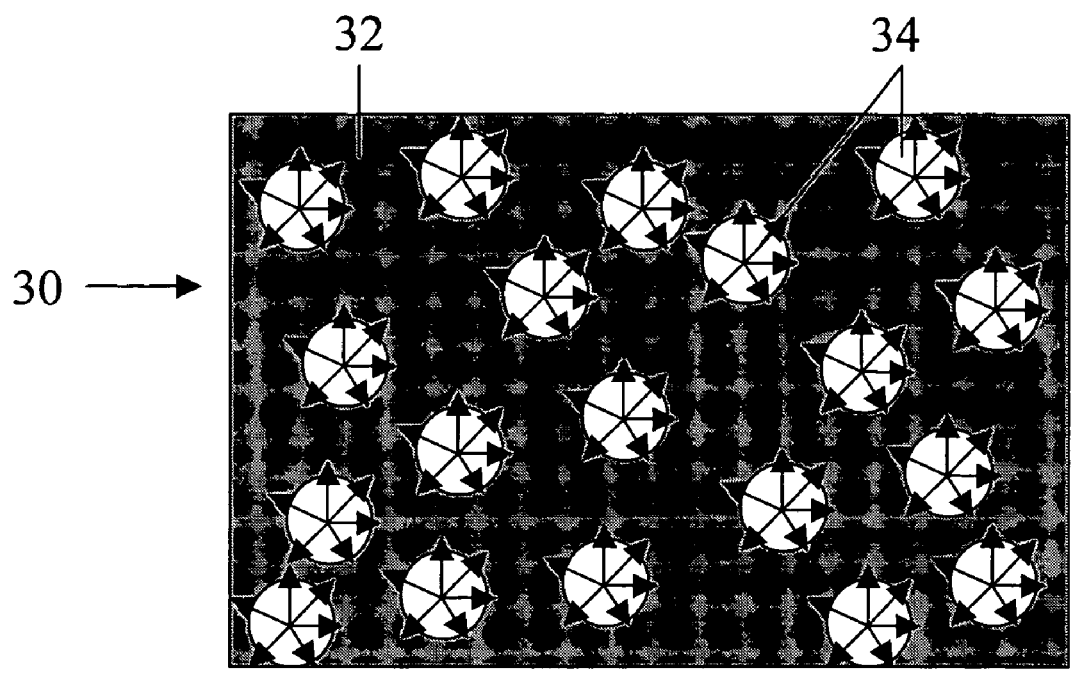
FIG. 6 is a schematic top plan view showing the distribution of discontinuous polycrystalline silicon "islands" in the partially crystallized layer shown in FIG. 5.

FIG. 6 is a schematic top plan view showing the distribution of discontinuous polycrystalline silicon "islands" 34 in the partially crystallized layer 30.

Once crystallization has been initiated, the crystallization-inducing, metal-containing layer 20, and metal elements in the amorphous silicon 32 are no longer needed and, according to the present invention, are at least partially removed in a further step after this first heat-treatment, step 106 of FIG. 2. There should not be anything of the metal element or metal element-containing layer 20 left on top of the partially crystallized layer 30 if it is thin enough. If anything remains, is it removed prior to the deposit of the gettering layer, e.g. by conventional acid or HF clean.

Figure 7:
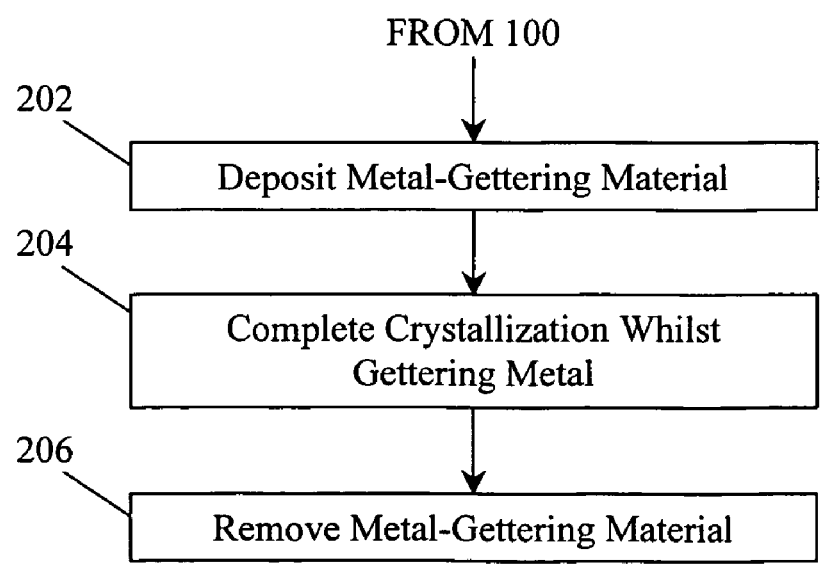
FIG. 7 is a flowchart indicating an exemplary set of component steps in the crystallization completion and metal removal step 200 of FIG. 1.

FIG. 7 is a flowchart indicating an exemplary set of component steps in the crystallization completion and metal removal step 200 of FIG. 1. A metal-gettering material is deposited in a layer, in step 202, on the partially crystallized thin film 30 produced by step 106 of the process of FIG. 2 and shown schematically in FIGS. 5 and 6. Suitable materials for the metal-gettering layer include phosphosilicate glass, phosphorus or noble gas doped germanium, phosphorus or noble gas doped amorphous and polycrystalline silicon. The gettering material layer is typically about 10 nm to about 1000 nm thick.

In the preferred embodiment, the gettering material is deposited on top of the partially crystallized thin film 30. It could be introduced within the amorphous silicon film but that is often not preferred because the gettering agent may change the properties of the resulting polycrystalline silicon. A bottom gettering layer is also not preferred because its presence may have a material effect on the characteristics of the devices built on the resulting polycrystalline silicon.

Figure 8:
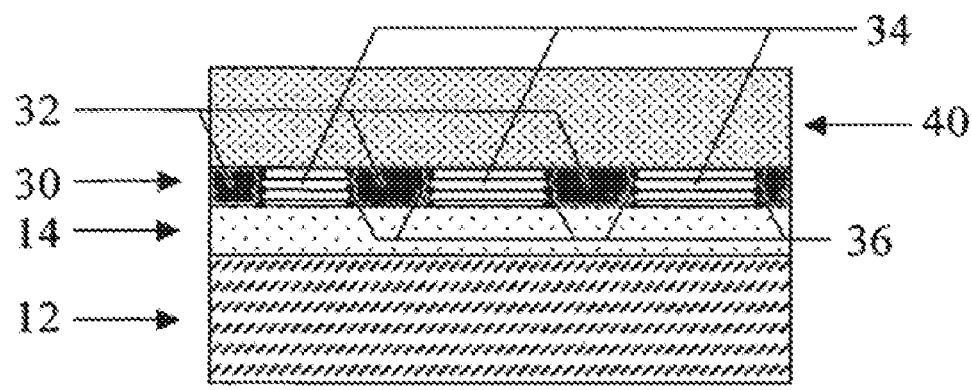
FIG. 8 is a schematic cross-section of the structure of FIG. 6 with a metal-gettering layer deposited on the partially crystallized thin film.

FIG. 8 is a schematic cross-section of the structure of FIG. 6 with a metal-gettering layer 40 deposited on the partially crystallized thin film 30.

In step 204 of FIG. 7, a second heat-treatment process occurs to complete the crystallization of the partially crystallized thin film 30 of FIG. 8. During the second heat treatment, metal elements within the partially crystallized amorphous silicon layer 30 and any remaining metal elements from the metal element or metal element containing compound layer 20 are gettered from both the polycrystalline silicon and amorphous silicon by the gettering material 40. The gettering rate is generally higher at the crystallization fronts, because of the higher metal concentrations.

Figure 9A:
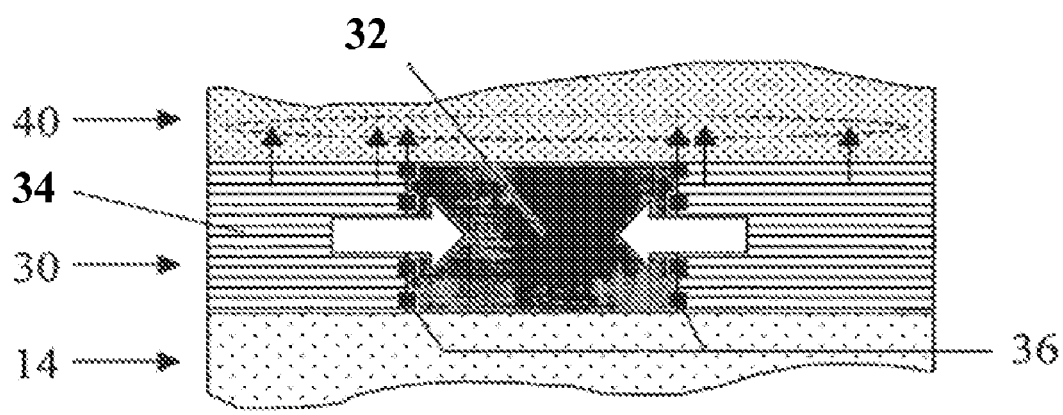
FIGS. 9A and 9B are schematic cross-sections of the structure of FIG. 8, during a second heat-treatment.
Figure 9B:
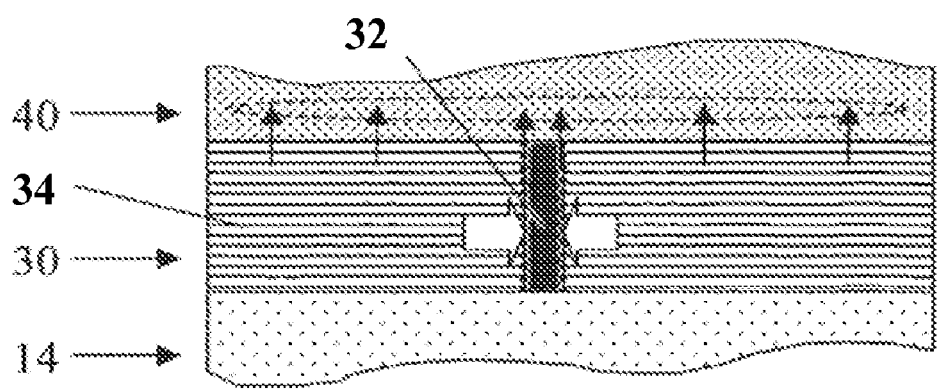

FIGS. 9A and 9B are schematic cross-sections of the structure of FIG. 8, during the second heat-treatment process, of step 204 of FIG. 7, at different times during the process. Metal elements within the partially crystallized amorphous silicon layer 30 are gettered out of the polycrystalline silicon portions 34 by the gettering layer 40 as the polycrystalline silicon "islands" 34 grow (FIG. 9A). The polycrystalline silicon "islands" 34 grow such that the regions of amorphous silicon 32 become islands within a layer of polycrystalline silicon, in FIG. 9B. Eventually, the islands of amorphous silicon 32 disappear and only polycrystalline silicon remains. The time taken depends on the process temperature and the amount of metal to be removed. For example, at about 550-590° C., it may take from 2 to 4 hours, with the amount of metal remaining depending on the temperature and time. A lower final concentration requires a longer gettering time. It is a trade-off between processing throughput and device performance. Thus the process is a controlled process, controlling the final result. Given that the present invention removes metal elements from the silicon, more metal elements than in the prior art may be diffused in initially.

Figure 10:
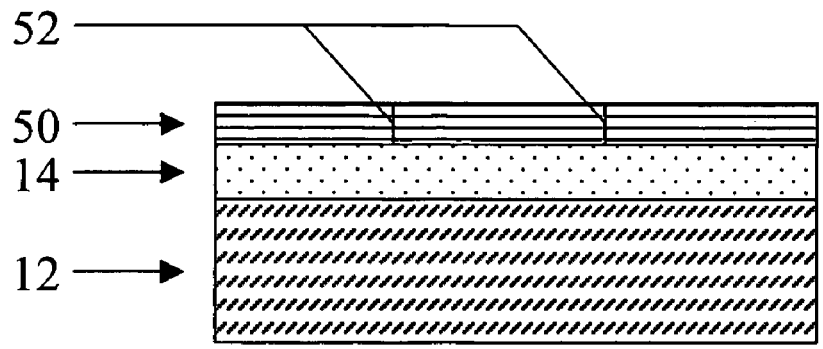
FIG. 10 is a schematic cross-section of a metal-induced crystallized polycrystalline silicon film.

In step 206 of FIG. 7, the gettering layer 40 is removed, for example using a buffered oxide etchant, e.g. HF-containing solutions, for about 1 min at room temperature for about 700 nm PSG. The resulting metal-induced crystallized polycrystalline silicon film 50 is shown in schematic cross-section in FIG. 10. Compared with polycrystalline silicon produced by standard methods, there is significantly less metal concentrated where the crystallization fronts 52 meet, typically no more than about 0.01%.

The above-described exemplary process forms high-quality, large-area polycrystalline silicon thin films by metal-induced crystallization of amorphous silicon. There is large-area crystallization, but with reduced metal contamination and improved device performance while retaining the advantage of a reduced process time by removing a controlled amount of metal elements in-situ during the growth of the polycrystalline silicon grains.

Whilst in the above-described embodiment, the metal is diffused into the amorphous silicon layer during the initial crystallization step, it does not have to be. For instance the amorphous silicon can be formed with the metal already diffused therein. Alternatively, the metal can be diffused into the amorphous silicon by way of implantation.

Figure 11:
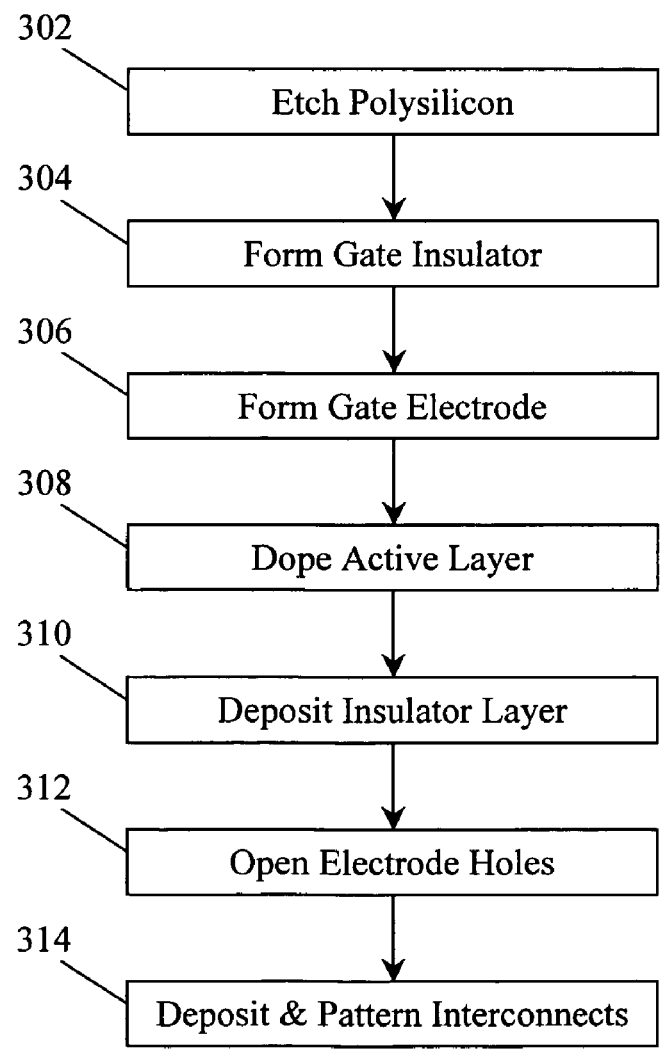
FIG. 11 is a flowchart of steps used in an exemplary process for making a TFT using a polycrystalline silicon film.
Figure 12:
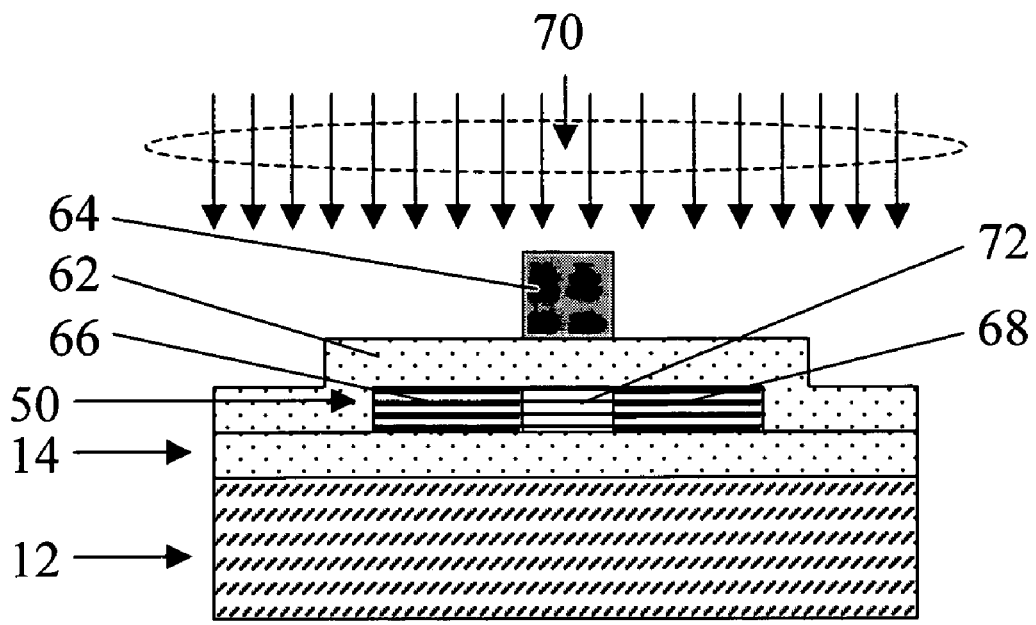
FIG. 12 is a schematic cross-section of a partially completed transistor.
Figure 13:
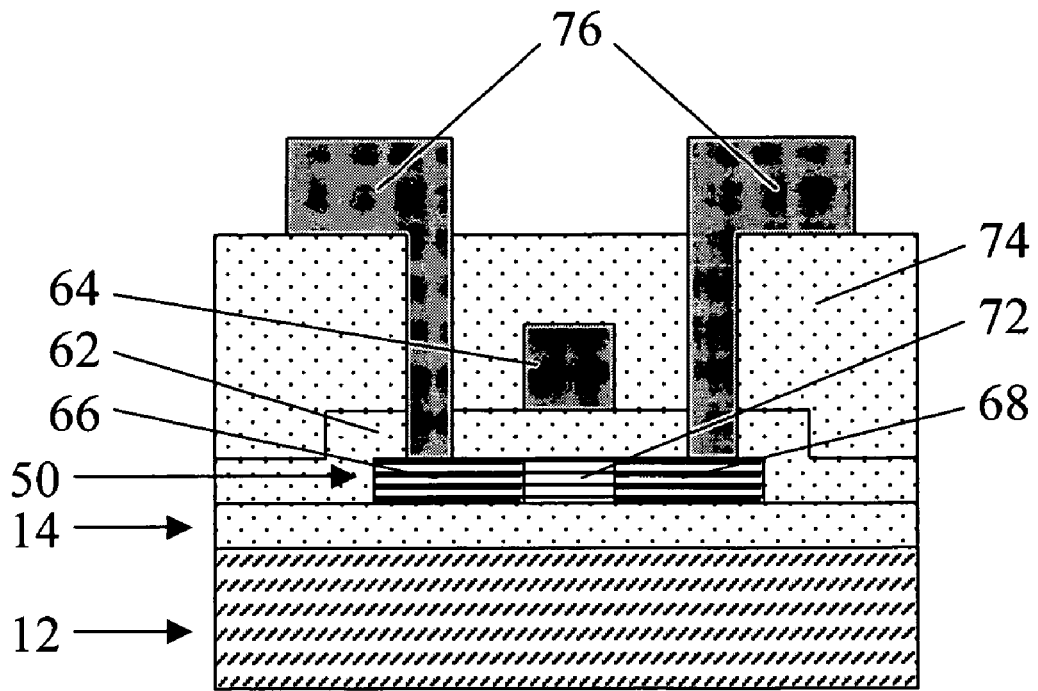
FIG. 13 is a schematic cross-section of the completed transistor.

The thus-produced polycrystalline silicon film may, for example, be used for making a thin film transistor, according to a further aspect of the invention. One possible approach is now described with reference to FIGS. 11, 12 and 13. FIG. 11 is a flowchart of steps used in an exemplary process for making a TFT using the polycrystalline silicon film provided, for example, according to the above described process. FIG. 12 is a schematic cross-section of the partially completed transistor and FIG. 13 is a schematic cross-section of the completed transistor.

The polycrystalline silicon film is etched down to a suitable active layer region 60, step 302. A gate-insulator layer 62 is formed above and around the active layer 60, step 304, for instance using silicon oxide, silicon oxynitride or silicon nitride. A gate electrode 64 is formed on the gate-insulator 62, above the middle of the active layer region 60 (but not covering all of it), step 306. A source region 66 and a drain region 68 are formed by heavily doping the active layer with impurities 70, step 308, except for the channel region 72, in between the source region 66 and drain region 68, which is masked by the gate electrode 64.

An insulator layer 74 is deposited on top of the gate-insulator layer 62 and gate electrode 64, step 310. Contact holes are opened to the gate electrode 64, source region (now electrode) 66 and drain region (now electrode) 68, step 312. Metal interconnects 76 are deposited on the three electrodes and patterned, step 314. The manufacture of the transistor, once the polycrystalline silicon has been formed, uses conventional techniques.

Whilst an example has been given of using polycrystalline silicon produced according to one embodiment, to make a thin film transistor, the polycrystalline silicon of the present invention is not limited thereto but can be used for other purposes too.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method of crystallizing a silicon thin film, comprising:
providing, on a substrate, an amorphous silicon thin film having metal elements therein for Metal-Induced Crystallizing (MIC) of the amorphous silicon thin film;
depositing a metal-gettering layer on the other side of the amorphous silicon thin film from the substrate; and
metal-induced crystallizing the amorphous silicon thin film whilst simultaneously removing the metal elements therefrom by the gettering metal.

2. The method of claim 1, further comprising:
pre-crystallizing a plurality of portions of the amorphous silicon thin film by Metal-Induced Crystallization (MIC) until a majority portion of the amorphous silicon thin film is crystallized before depositing the metal-gettering layer.

3. The method of claim 1, further comprising:
providing the amorphous silicon thin film prior to Metal-Induced Crystallizing the amorphous silicon thin film.

4. The method of claim 1, further comprising:
introducing a thin film of metal or metal-containing compound on top of the amorphous silicon thin film prior to Metal-Induced Crystallizing the amorphous silicon thin film.

5. The method of claim 4, wherein Metal-Induced Crystallizing the amorphous silicon thin film comprises annealing the amorphous silicon thin film and metal or metal-containing compound to form discontinuous polycrystalline silicon regions.

6. The method of claim 5, wherein the amorphous silicon thin film and metal or metal-containing compound are annealed at a temperature of about 450° C. to about 600° C.

7. The method of claim 4, wherein Metal-Induced Crystallizing the amorphous silicon thin film comprises heat treating the amorphous silicon thin film with the deposited metal-gettering layer.

8. The method of claim 7, wherein the heat treatment is conducted at a temperature of about 550° C. to about 600° C.

9. The method of claim 4, wherein the thin film of metal or metal-containing compound comprises at least one of (a) one or more metals selected from a group consisting of Ni, Cr, Pd, Ti, Mo, Al and Au, and (b) at least one mixture comprising one or more of Ni, Cr, Pd, Ti, Mo, Al and Au.

10. The method of claim 4, wherein the thin film of metal or metal-containing compound is about 1 nm to about 10 nm thick.

11. The method of claim 1, wherein Metal-Induced Crystallizing the amorphous silicon thin film comprises Metal-Induced Crystallizing one or more uncrystallized portions such that the amorphous thin film becomes a polycrystalline silicon thin film.

12. The method of claim 11, further comprising:
removing the deposited metal-gettering material after the Metal-Induced Crystallizing of the one or more uncrystallized portions.

13. The method of claim 1, wherein Metal-Induced Crystallizing the amorphous silicon thin film comprises, substantially, only initiating crystallization of the amorphous silicon thin film.

14. The method of claim 1, wherein Metal-Induced Crystallizing the amorphous silicon thin film comprises completing the crystallization of the amorphous silicon thin film.

15. The method of claim 1, wherein the amorphous silicon thin film is formed by a process selected from the group consisting of low temperature chemical vapor deposition, plasma enhance chemical vapor deposition and sputtering.

16. The method of claim 1, wherein the amorphous silicon thin film is about 10 nm to about 3000 nm thick.

17. The method of claim 1, wherein the metal-gettering material comprises a material selected from the group consisting of phosphosilicate glass, phosphorus or noble gas doped germanium and phosphorus or noble gas doped amorphous or polycrystalline silicon.

18. The method of claim 1, wherein the metal-gettering material is in a layer about 10 nm to about 1000 nm thick.

19. The method of claim 1, wherein the amorphous silicon thin film is provided on a substrate of a material selected from the group consisting of glass, polymer, insulated stainless steel, polycrystalline silicon, and single crystal silicon containing prefabricated integrated circuits.

20. A method of forming a thin film transistor comprising:
forming a polycrystalline silicon thin film;
forming a reduced area of the polycrystalline silicon thin film;
forming a gate electrode; and
forming source and drain electrodes from the reduced area polycrystalline silicon thin film;
wherein the polycrystalline thin film is formed by crystallizing an amorphous silicon thin film according to claim 1.

* * * * *